(12) United States Patent
Frey et al.

(10) Patent No.: US 7,620,524 B2
(45) Date of Patent: Nov. 17, 2009

(54) METHOD FOR RECONSTRUCTING AN ELECTRICAL SIGNAL

(75) Inventors: Bernd Frey, Kirchheim (DE);
Burkhard Iske, Weil der Stadt (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 11/664,746

(22) PCT Filed: Aug. 24, 2005

(86) PCT No.: PCT/EP2005/054162
§ 371 (c)(1),
(2), (4) Date: Jun. 11, 2008

(87) PCT Pub. No.: WO2006/037694
PCT Pub. Date: Apr. 13, 2006

(65) Prior Publication Data
US 2008/0281559 A1 Nov. 13, 2008

(30) Foreign Application Priority Data
Oct. 5, 2004 (DE) .................. 10 2004 048 321
Jul. 28, 2005 (DE) .................. 10 2005 035 416

(51) Int. Cl.
*G06F 3/00* (2006.01)
(52) U.S. Cl. ............... 702/189; 702/179; 702/183; 702/197
(58) Field of Classification Search .......... 702/64, 702/75, 85, 119, 122, 182, 189, 190, 179, 702/183, 197; 341/122, 155; 375/247; 704/216
See application file for complete search history.

(56) References Cited

U.S. PATENT DOCUMENTS

| | | | |
|---|---|---|---|
| 3,676,770 A | | 7/1972 | Sharaf et al. |
| 3,839,675 A | * | 10/1974 | Wernikoff et al. ............ 375/247 |
| 4,390,841 A | | 6/1983 | Martin et al. |
| 4,849,700 A | | 7/1989 | Morioka et al. |
| 5,281,919 A | | 1/1994 | Palanisamy et al. |
| 5,592,094 A | | 1/1997 | Ichikawa et al. |
| 5,640,161 A | * | 6/1997 | Johnson et al. ............ 341/122 |
| 5,698,983 A | | 12/1997 | Arai et al. |
| 5,699,477 A | * | 12/1997 | McCree ...................... 704/216 |
| 5,703,486 A | | 12/1997 | Arai et al. |
| 6,002,238 A | | 12/1999 | Champlin et al. |
| 6,044,331 A | | 3/2000 | Saigo et al. |
| 6,115,675 A | | 9/2000 | Benco et al. |
| 6,417,670 B1 | | 7/2002 | Kang |

FOREIGN PATENT DOCUMENTS

| | | |
|---|---|---|
| EP | 1 055 934 | 11/2000 |
| FR | 2 835 923 | 8/2003 |
| JP | 58-156871 | 9/1983 |
| WO | WO 01/51947 | 7/2001 |

* cited by examiner

*Primary Examiner*—Hal D Wachsman
*Assistant Examiner*—Felix E Suarez
(74) *Attorney, Agent, or Firm*—Kenyon & Kenyon LLP

(57) ABSTRACT

A method for reconstructing an electrical signal in which the signal and a second signal, which is related to the first signal according to a predefined function, are sampled at a predefined sampling rate. The occurrence of aliasing in a downstream digital low-pass filter may be substantially reduced if missing sampling values of the first signal are calculated from the sampling values of the second signal with the aid of the known function.

15 Claims, 3 Drawing Sheets

METHOD FOR RECONSTRUCTING AN ELECTRICAL SIGNAL

FIELD OF THE INVENTION

The present invention relates to a method for reconstructing an electrical signal.

BACKGROUND INFORMATION

In digital measuring technology, sampling an analog measuring signal with the aid of an A/D converter at a high sampling rate and then digitally processing it further is known. The sensor signal is usually low-pass filtered before sampling to comply with the sampling theorem. This ensures that no frequencies that are greater than one-half of the sampling frequency occur in the sensor signal. In some measuring systems, it is, however, not possible for technical reasons to use low-pass filters having a sufficiently low critical frequency. In this case, it is impossible to prevent aliasing from occurring at a downstream digital low-pass filter. This is explained in greater detail using the example of FIG. 1:

FIG. 1 shows current signal I of a current sensor which works according to the inductive measuring principle. The polarity of a sensor coil is periodically switched over in this case. During this switchover operation, it is impossible to register any valid current measuring values. The range in which no valid measuring values may be registered is labeled with the reference numeral 4, and the range in which the current sensor delivers valid measuring values is labeled with the reference numeral 3.

To reconstruct current signal I in invalid measuring ranges 4, it is known to approximate the missing measuring values via a linear equation, for example. A straight line 20 is drawn between the latest validly measured current value and the next validly measured current value, and a plurality of intermediate values 6 lying on this straight line 20 is calculated. In the figure, valid sampling values are labeled with the reference numeral 5 and reconstructed sampling values with reference numeral 6. Approximated signal 1 is subject to an error of differing magnitudes depending on the phase angle of the reconstructed values. Signal 1 is removed by downstream low-pass filtering and only the reconstruction error is preserved. Since this error is not constant but fluctuates with the phase angle of the reconstructed values, a low-frequency error signal is obtained at the output of the low-pass filter, which may be viewed as aliasing.

SUMMARY OF THE INVENTION

It is therefore an object of the exemplary embodiment and/or exemplary method of the present invention to provide a method and a device for reconstructing a sampled electrical signal in which the occurrence of aliasing may be considerably reduced or fully eliminated.

This object of the exemplary embodiment and/or exemplary method of the present invention is achieved by the features described herein. Further embodiments of the exemplary embodiment and/or exemplary method of the present invention are also described herein.

One important idea of the exemplary embodiment and/or exemplary method of the present invention is to calculate the missing sampling values of the signal from the sampling value of a second signal related to the first signal according to a predefined function f, i.e., to reconstruct the signal on the basis of a second signal, in time segments of the analog signal in which it is impossible to generate any valid sampling values. When the functional relationship between the two signals is known, a missing sampling value may be easily calculated. The following applies: S1=f(S2), where S1 is a reconstructed "sampling" value of the first signal and S2 is a sampling value of the second signal.

A measuring system for reconstructing a sampled electrical signal which works according to the above-described method includes, according to the exemplary embodiment and/or exemplary method of the present invention, a first signal source (for example, a current sensor), which delivers a first analog signal, and a second signal source (for example, a voltage sensor), which delivers a second electrical signal, the two signals being related according to a predefined function (I=f(U)). The measuring system further includes two sampling devices for sampling the two signals. A computing device is also provided, to which the sampled values of the second signal are supplied and which calculates the missing sampling values of the first signal from the sampling values of the second signal, taking into account the functional relationship.

The exemplary method according to the present invention for reconstructing a sampled signal may be used, for example, for measuring the internal resistance (Ri) of a battery. In this case, the measuring system includes a current sensor and a voltage sensor from whose signals the internal resistance is calculated. The following applies for internal resistance Ri: Ri=deltaU/deltaI. In time segments in which it is impossible to generate valid sampling values of the current signal, the missing sampling values may be calculated according to the following relationship: deltaI=deltaU/Ri. Internal resistance Ri forms the functional relationship. Current signal I is thus reconstructed on the basis of sampling values of the voltage signal and function f. Functional relationship f (for example, internal resistance Ri) may be continuously recalculated.

According to a special specific embodiment of the present invention, the computing device calculates the sampling values of the first signal also in time segments in which the first signal is valid and ascertains a difference between the reconstructed and measured sampling values (or between derived quantities such as, for example, the difference between a measured internal resistance Ri and an internal resistance determined from reconstructed values). The difference may be compared with a predefined threshold value. If the difference is less than the threshold value, the first signal is reconstructed in the invalid segments on the basis of the second signal. In contrast, if the difference exceeds the threshold value, another interpolation method (for example, linear interpolation) may be used and the missing sampling values are determined using this method. This prevents a quantity calculated from the reconstructed signal (such as, for example, the internal resistance of a battery) from being calculated on the basis of invalid values. This monitoring may remain continuously active and, on the basis of the difference between calculated and measured values, decides whether or not the first signal may be reconstructed on the basis of dependent measured quantities.

DETAILED DESCRIPTION

Figure 1:
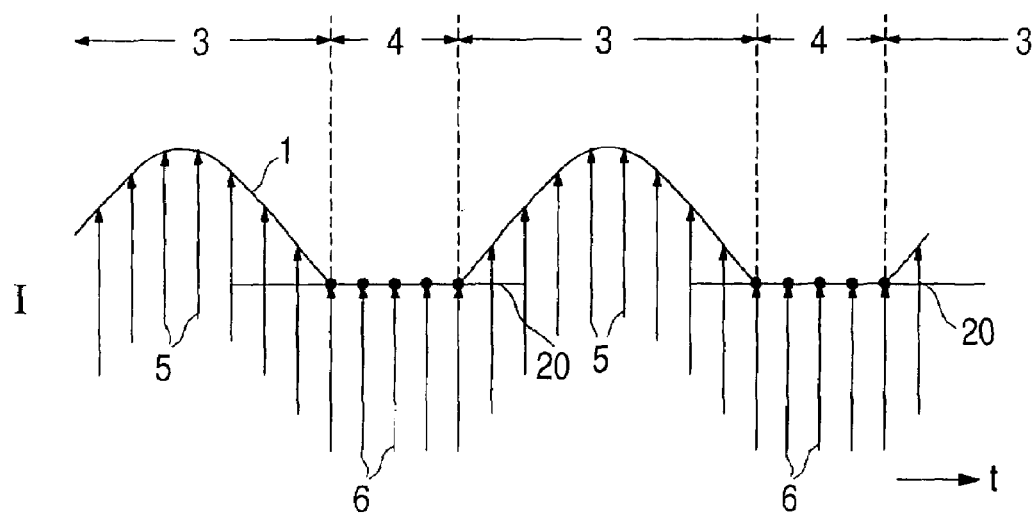
FIG. 1 shows a current signal, having sampling values, of an inductive current sensor.

Reference is made to the introduction of the description for elucidating FIG. 1.

Figure 2:
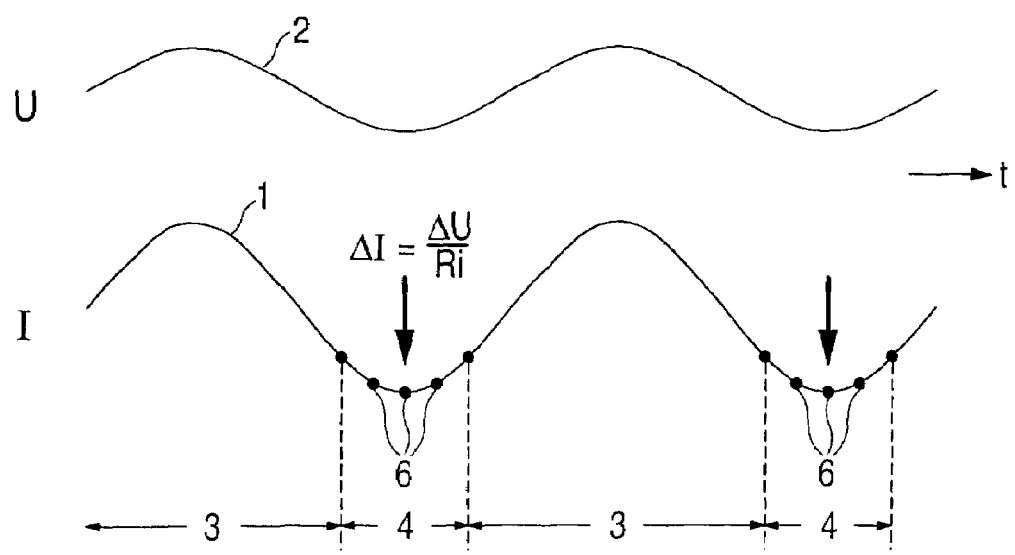
FIG. 2 shows a voltage signal and a reconstructed current signal.

FIG. 2 shows the variation over time of a system voltage U and a battery current I in a motor vehicle electrical system. System voltage U and battery current I have a certain ripple content, i.e., an alternating component superimposed on the direct current and the direct voltage due to the multiple switching operations in the vehicle electrical system.

Voltage signal 2 is a constant signal; in contrast, current signal 1 has periodic segments 4, in which no valid measured values are present due to the inductive measurement principle of current sensor 8.

For calculating internal resistance Ri of a battery, both analog signals 1,2 are sampled at a predefined sampling frequency and then digitally processed further. No valid sampling values 5 may be generated in segments 4. To reconstruct current signal 1, missing sampling values 6 are therefore calculated from the measured values of voltage signal 2 and signal 1 is interpolated in segments 4.

Battery current I and system voltage U are not independent measured quantities, but are linked via internal resistance Ri of the battery. In addition, this relationship is relatively steady compared to the sampling frequency. The missing sampling values of current signal 1 may therefore be calculated from the ratio of the variation of voltage deltaU to internal resistance Ri of the battery, where the following relationship applies to the current variation: DeltaI=deltaU/Ri.

Missing sampling values 6 may be generated at the same frequency as the sampling frequency.

Figure 3:
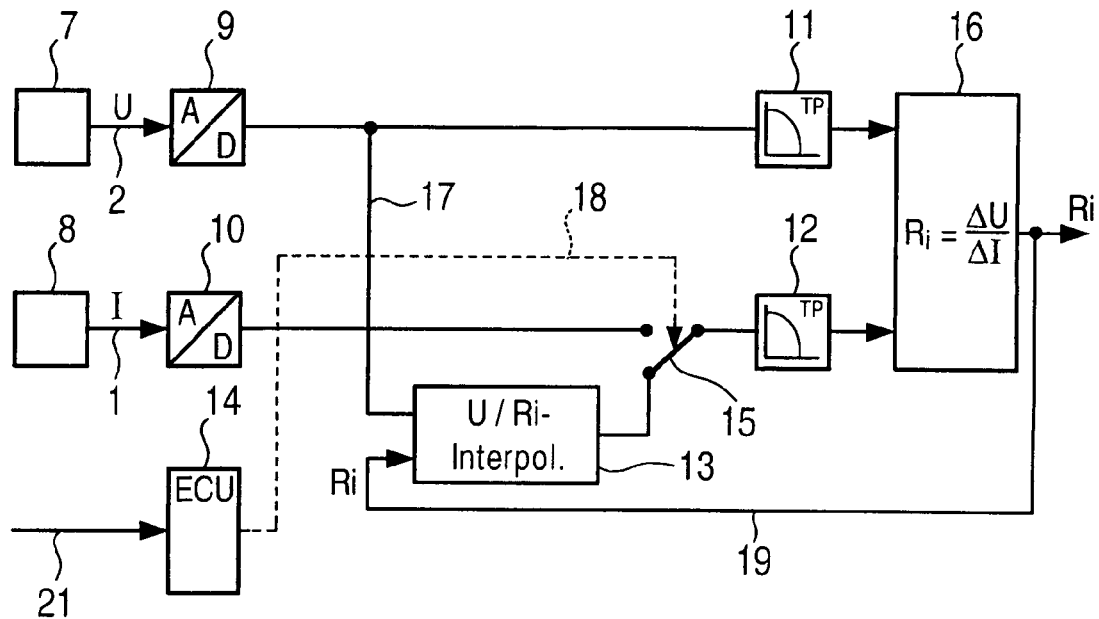
FIG. 3 shows a measuring system for calculating the internal resistance of a battery.

FIG. 3 shows a measuring system for determining internal resistance Ri of a vehicle battery. The measuring system includes a voltage sensor 7 for measuring a system voltage U, which generates an analog voltage signal 2, and a current sensor for measuring battery current I, which generates an analog current signal 1. A low-pass filter (integrated in blocks 7 and 8) filters signals 1,2 before they are supplied to A/D converters 9,10. Low-pass filtering ensures that the sampling theorem is complied with to the maximum degree and analog signals 1,2 possibly contain no frequencies which are higher than one-half the sampling frequency of A/D converters 9,10.

Signals 1,2, converted to digital signals, are then supplied to a low-pass filter 11,12, respectively. A processor unit 16, downstream from low-pass filters 11,12, in which a computing algorithm is stored, subsequently calculates internal resistance Ri of the battery from filtered signals 1,2 according to the relationship: Ri=delta U/delta I.

Due to the previously described sampling gaps 4 in sampled current signal 1, aliasing and thus an incorrect internal resistance calculation may occur at the output of low-pass filter 12. To avoid this, a computing unit 13 is provided, which calculates sampling values 6 in invalid signal segments 4 from the relationship between current I and voltage U. The following applies: delta I=delta U/Ri.

For this purpose, computing device 13 is connected to the output of processor unit 16 and receives from the latter a previously calculated value for internal resistance Ri. In addition, computing unit 13 is connected to A/D converter 9 and receives from the latter an instantaneous sampling value 5 of voltage signal 2. The output of computing unit 13 may be connected to low-pass filter 12 via a switch 15.

In sampling gaps 4, switch 15 is closed by a logic 14 (control line 18) and thus the output of computing unit 13 is connected to low-pass filter 12. Unit 16 then receives reconstructed current values 6 from computing unit 13. In the remaining time segments 3, in which valid sampling values 5 may be generated, switch 15 is open. Internal resistance Ri may thus be correctly continuously calculated.

Time segments 4 in which no valid measured values are available are known from a sensor switchover signal 21, which is supplied to logic 14.

Figure 4:
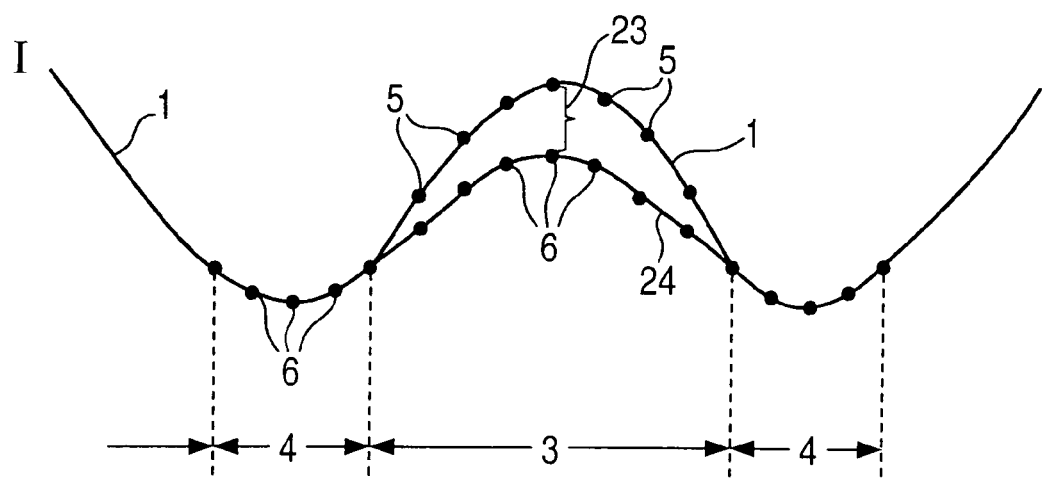
FIG. 4 shows a measured and a calculated current signal.

FIG. 4 shows analog current signal 1 of current sensor 8 including a plurality of measured sampling values 5. In addition, in central segment 3, a calculated signal 24 is shown having a plurality of reconstructed values 6 which were calculated with the aid of a voltage signal.

Unlike in FIG. 2, here reconstructed values 6 are calculated not only in invalid signal segments 4, but also in valid segments 3. In addition, a difference 23 between measured and reconstructed values 5 and 6 (or between derived quantities such as, for example, the difference between a measured internal resistance Ri and an internal resistance determined from reconstructed values) is calculated to check the accuracy of the Ri calculation. The difference is very small in the case of quasi-steady signals U, I, but usually not equal to zero, since the reconstructed values are calculated on the basis of an "obsolete" internal resistance Ri, i.e., with a time delay. In the case of non-quasi-steady signals U, I (such as in the case of an intermittent electrical contact of the battery), a substantial difference 23 may result.

If difference 23 is less than the threshold value, the first signal is reconstructed on the basis of the second signal. In contrast, if difference 23 exceeds the threshold value, another interpolation method (for example, linear interpolation) is used in signal segments 4 and the missing sampling values are determined using this method. If difference 23 drops below the threshold value again, the reconstruction according to the exemplary embodiment and/or exemplary method of the present invention on the basis of voltage signal U may continue.

Figure 5:
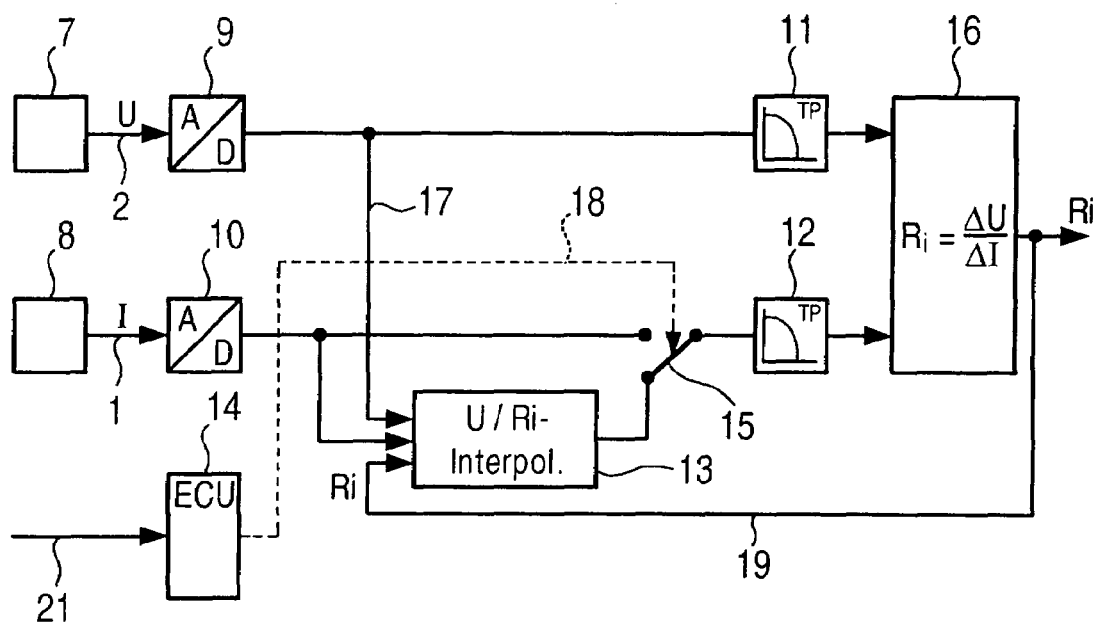
FIG. 5 shows a measuring system for calculating the internal resistance of a battery according to a special specific embodiment of the present invention.

FIG. 5 shows a measuring system for determining internal resistance Ri of a vehicle battery in which the accuracy of the interpolation is monitored. The measuring system has an essentially identical design to that of FIG. 3 and also includes a voltage sensor 7 and a current sensor 8, whose signals are sampled by associated sampling elements 9 and 10, respectively. The sampled signals are then again filtered (low-pass filters 11 and 12) and internal resistance Ri of the battery is calculated with the aid of algorithm 16.

Unlike FIG. 3, interpolation unit 13 calculates reconstructed current value 6 continuously, i.e., also in valid segments 3. A "measured" and "reconstructed" internal resistance Ri is continuously ascertained from measured and reconstructed current values 5 and 6. Unit 13 also calculates a difference between measured and reconstructed internal resistance Ri and performs a threshold value comparison to monitor the accuracy of the Ri calculation. If the difference is less than the threshold value, the first signal is reconstructed in invalid segments 4 on the basis of the second signal and the corresponding values are supplied to processor unit 16. In contrast, if the difference exceeds the threshold value, another interpolation method (for example, linear interpolation) is used in signal segments 4 and the missing sampling values are determined using this method because otherwise the error in calculating internal resistance Ri might be excessive.

This monitoring of the Ri calculation may be continuously active and, on the basis of the difference between calculated and measured signals 1 and 24, decides whether or not current signal 1 may be reconstructed on the basis of voltage signal 2.

The list of reference numerals is as follows:
1 current signal;
2 voltage signal;
3 valid measuring range;
4 invalid measuring range;
5 sampling values;
6 reconstructed sampling values;
7 voltage sensor;
8 current sensor;
9 A/D converter;
10 A/D converter;
11 digital low-pass filter;
12 digital low-pass filter;
13 computing device;
14 logic;
15 switch;
16 processor unit;
17 connecting line;
18 control line;
19 feedback;
20 approximation straight line;
21 switchover signal;
23 difference;
24 calculated signal;
I current; and
U voltage.

What is claimed is:

1. A method for reconstructing an analog electrical signal, the method comprising:
   sampling a first analog electrical signal using a first sampling device and sampling a second analog electrical signal using a second sampling device, the first signal and the second signal being related according to a predefined function, the sampling of the first and second signals each occurring at predefined sampling rates;
   at the first sampling device, generating a set of initial sampling values of the first signal, the set of initial sampling values including measured sampling values and further including missing sampling values corresponding to time segments in which no valid sampling values are generated;
   calculating the missing sampling values of the first signal from sampling values of the second signal by taking into account the predefined function; and
   outputting a reconstructed signal that includes the measured sampling values and the calculated missing sampling values.

2. The method of claim 1, wherein the first signal is a current signal and the second signal is a voltage signal.

3. The method of claim 1, wherein the missing sampling values are calculated with a function deltaI=deltaU/Ri.

4. The method of claim 1, further comprising:
   calculating, from sampling values of the second signal and by taking into account the predefined function, a second set of sampling values of the first signal, the second set of sampling values corresponding to the time segments in which the first signal is valid and in which the measured sampling values are available.

5. The method of claim 4, wherein the difference between (i) the second set of sampling values and at least one of (ii) the measured sampling values and the values derived from the measured sampling values, are ascertained and compared with a threshold value.

6. The method of claim 5, wherein, if the difference is less than the threshold value, the first signal is reconstructed in the invalid segments based on the second signal and, if the difference exceeds the threshold value, the system switches over to another interpolation method.

7. A device for reconstructing of an analog electrical signal, comprising:
   a first signal source configured to generate a first electrical signal;
   a second signal source configured to generate a second electrical signal, the first and second electrical signals being related according to a predefined function;
   a sampling device configured to sample the first signal and the second signal; and
   a computing device, to which sampling values of the second signal are supplied the computing device configured to calculate missing sampling values of the first signal from the sampling values of the second signal, taking into account the known function.

8. The device of claim 7, wherein at the output of the computing device a switch is provided by which the calculated sampling values are supplied for further digital processing in predefined time segments.

9. The device of claim 7, further comprising:
   a low-pass filter which is connectable optionally to one of the sampling device and the computing device with the switch.

10. The device of claim 7, wherein the first signal source is a current sensor and the second signal source is a voltage sensor.

11. The device of claim 7, further comprising:
    a low-pass filter to filter the sampling values of the first signal; and
    another low-pass filter to filter the sampling values of the second signal.

12. The device of claim 11, wherein an algorithm is used to calculate a predefined quantity from the filtered sampling values.

13. The device of claim 7, wherein the computing device calculates a second set of sampling values of the first signal, the second set of sampling values corresponding to time segments in which the first signal is valid and in which measured sampling values of the first signal are available.

14. The device of claim 13, wherein the difference between the second set of sampling values and the measured sampling values is ascertained and compared with a threshold value.

15. The device of claim 14, wherein the first signal is reconstructed in the invalid segments based on the second signal if the difference is less than the threshold value, and the system switches over to another interpolation method if the difference exceeds the threshold value.

* * * * *